US011828813B2

(12) United States Patent
Kurtz et al.

(10) Patent No.: US 11,828,813 B2
(45) Date of Patent: Nov. 28, 2023

(54) BATTERY MANAGEMENT SYSTEM FOR AN ELECTRIC AIR VEHICLE

(71) Applicant: Lilium eAircraft GmbH, Wessling (DE)

(72) Inventors: Johannes Kurtz, Grosskarolinenfeld (DE); Moritz Schuhmann, Munich (DE)

(73) Assignee: Lilium eAircraft GmbH, Wessling (DE)

( * ) Notice: Subject to any disclaimer, the term of this patent is extended or adjusted under 35 U.S.C. 154(b) by 0 days.

(21) Appl. No.: 17/651,726

(22) Filed: Feb. 18, 2022

(65) Prior Publication Data
US 2022/0268850 A1 Aug. 25, 2022

(30) Foreign Application Priority Data
Feb. 19, 2021 (EP) ..................................... 21158082

(51) Int. Cl.
*G01R 31/392* (2019.01)
*G01R 31/389* (2019.01)
(Continued)

(52) U.S. Cl.
CPC ............ *G01R 31/392* (2019.01); *B60L 50/60* (2019.02); *B60L 58/12* (2019.02); *B60L 58/16* (2019.02); *B64D 27/24* (2013.01); *G01R 31/367* (2019.01); *G01R 31/389* (2019.01); *G01R 31/3842* (2019.01); *G01R 31/396* (2019.01);
(Continued)

(58) Field of Classification Search
None
See application file for complete search history.

(56) References Cited

U.S. PATENT DOCUMENTS

2019/0072618 A1  3/2019  Ghantous et al.
2020/0055407 A1  2/2020  Foley et al.
(Continued)

FOREIGN PATENT DOCUMENTS

CN   111983477 A   11/2020
JP   6701938 B2    5/2020
(Continued)

OTHER PUBLICATIONS

European Extended Search Report from European Application No. 21158082.4, dated Aug. 16, 2021, 9 pages.
International Search Report for International Application No. PCT/EP2022/053083, dated Apr. 21, 2022, 5 pages.
International Written Opinion for International Application No. PCT/EP2022/053083, dated Apr. 21, 2022, 7 pages.
(Continued)

*Primary Examiner* — Jas A Sanghera
(74) *Attorney, Agent, or Firm* — TraskBritt (57) ABSTRACT

A battery management system and method for performing a battery health parameter observation, in particular, cell impedance observation, with two redundant, independent and dissimilar lanes. Specifically, a cell impedance observation in a first one of the lanes is based on Electrochemical Impedance Spectroscopy, EIS. The other lane employs a different algorithm than EIS. In embodiments, a battery state observation is further performed independently by the two lanes, wherein again the first lane employs EIS and the other lane a different (dissimilar) algorithm. On the basis of state and health observation, state (state of function) of the battery system can be predicted to determine a range of flight in accordance with a predetermined flight profile.

15 Claims, 4 Drawing Sheets

(51) Int. Cl.
  *G01R 31/396* (2019.01)
  *G01R 31/3842* (2019.01)
  *G01R 31/367* (2019.01)
  *B60L 50/60* (2019.01)
  *B60L 58/12* (2019.01)
  *B60L 58/16* (2019.01)
  *H02J 7/00* (2006.01)
  *B64D 27/24* (2006.01)
  *B64C 29/00* (2006.01)
(52) U.S. Cl.
  CPC ............ *H02J 7/005* (2020.01); *H02J 7/0048* (2020.01); *B60L 2200/10* (2013.01); *B64C 29/00* (2013.01); *H02J 2310/44* (2020.01)

(56) References Cited

U.S. PATENT DOCUMENTS

2021/0003638 A1   1/2021   Mizoguchi
2022/0091062 A1*  3/2022   Gullapalli ............ G01R 31/007

FOREIGN PATENT DOCUMENTS

WO    2020/003841 A1   1/2020
WO    2020/044134 A1   3/2020

OTHER PUBLICATIONS

European Communication for Application No. 21158082.4 dated Jun. 30, 2023, 9 pages.

* cited by examiner

BATTERY MANAGEMENT SYSTEM FOR AN ELECTRIC AIR VEHICLE

CROSS-REFERENCE TO RELATED APPLICATION

Pursuant to 35 U.S.C. § 119(a), this application claims the benefit of the filing date of European Patent Application Serial No. EP21158082.4, filed Feb. 19, 2021, for "Battery Management System for An Electric Air Vehicle," the disclosure of which is hereby incorporated herein in its entirety by this reference.

TECHNICAL FIELD

The present disclosure relates to battery management systems. More specifically, the present disclosure relates to battery management systems for health monitoring of an energy storage system of an electric air vehicle.

BACKGROUND

In recent years, electricity has gained increasing importance as a form of energy for driving air vehicles. This includes, in particular, electric aircrafts with vertical take-off and landing functionality (eVTOL).

A crucial component for electric (i.e., electrically driven/electrically propelled) aircrafts, including eVTOL, is an appropriate energy storage system (ESS). The energy storage system may be realized in the form of a battery system of chargeable batteries, which may be structured into a plurality of individual battery cells. Individual battery cells may be combined together to form one or more battery modules of an aircraft battery system used as an energy storage system. Examples of a battery type suitable for being used in the framework of the present disclosure are Lithium (Li)-ion batteries, without the present disclosure being limited to this.

Generally speaking, the function of the energy storage system is to provide an electrically driven aircraft with sufficient accessible energy for safe flight and landing. As this is generally the case with respect to air traffic, the highest safety standards are applicable to the components of air vehicles, including the ESS. In order to ensure safe operation and, in particular, safe landing with the sufficient amount of remaining accessible energy, parameters of the ESS defining critical states that limit the amount of accessible energy must be monitored and communicated to an operator.

Such parameters include but are not limited to, for instance, a cell temperature or a state-of-charge (SOC) of individual battery cells of the ESS. As some of such parameters are not directly measurable quantities but relate to internal states, the design of the ESS must foresee appropriate equipment for a respective state observation. The state observation is based on the measurement of physical data, including but not being limited to terminal cell voltages, surface temperatures of cells or currents. Further, possibly residual errors in state determination have to be taken into account as potentially limiting the accessible energy and thus the range of an air vehicle. Such residual errors generally occur in view of the limited accuracy of any models used for describing the ESS and its states. Further, the accessible energy of a battery is highly dependent on the flight profile. Hence, the energy management system also has to perform a state prediction with regard to the planned flight profile until the electrically driven aircraft achieves safe landing. Specifically, in the framework of the present disclosure, terms like "monitoring" or "observation" are used to indicate that the respective data (state of function, health parameters) are determined not only at a particular point in time but so that their determination is repeated so as to gather information about their development over time, in particular, before and during a particular flight. Intervals of updating respective determinations may be set according to the circumstances and may, in particular, be set so small that a quasi-permanent observation is possible.

More generally speaking, it is distinguished between two types of relevant time dependent variables characterizing a battery system. On the one hand, (battery cell) states are defined by system variables that quickly evolve over time, i.e., in the order of seconds depending on the system input. Examples for cell states are the cell state-of-charge, cell core temperature or cell tab temperature. On the other hand, health parameters are system variables that slowly evolve over time, i.e., in the order of days, depending on the system input.

The significance of health parameter monitoring resides in the fact that the overall status of a battery, besides on particular variables reflecting a current charging status, further depends on additional factors, which may, in particular, reflect changes on a larger timescale during the life-cycle of the battery, such as ageing, and which are summarized under the term "health parameters." In particular, battery health parameters may include, without being limited to these, at least one of cell capacity and cell impedance.

It is therefore a crucial task during the design phase of the ESS that the maximum error of the state and health prediction for a planned flight is known and can be taken into account each time, during planning of an individual flight as well as during the flight itself, when the current status of the ESS, in particular, the remaining accessible energy defining the remaining flight range, is to be determined. The planned profile defines the consumed power over time and shall be in strict accordance with the operational requirements of the aircraft. The maximum error metric in state prediction for the complete lifetime of the ESS shall be considered as the safety margin. This assures that the residual errors in state observation and state prediction do not particularly influence the utilization of the ESS within its known physical limits.

Therefore, a state prediction that is based on state and health parameter monitoring can ensure that a planned profile does not violate any safety boundary until a safe landing has been reached. This allows an operator to confirm the usable energy and range for a given mission at any time during a flight according to a particular profile and before landing.

A schematic representation of the tasks to be performed by an energy management system for state observation and state prediction during a flight according to a particular flight profile will be described below with reference to FIG. 1.

Figure 1:
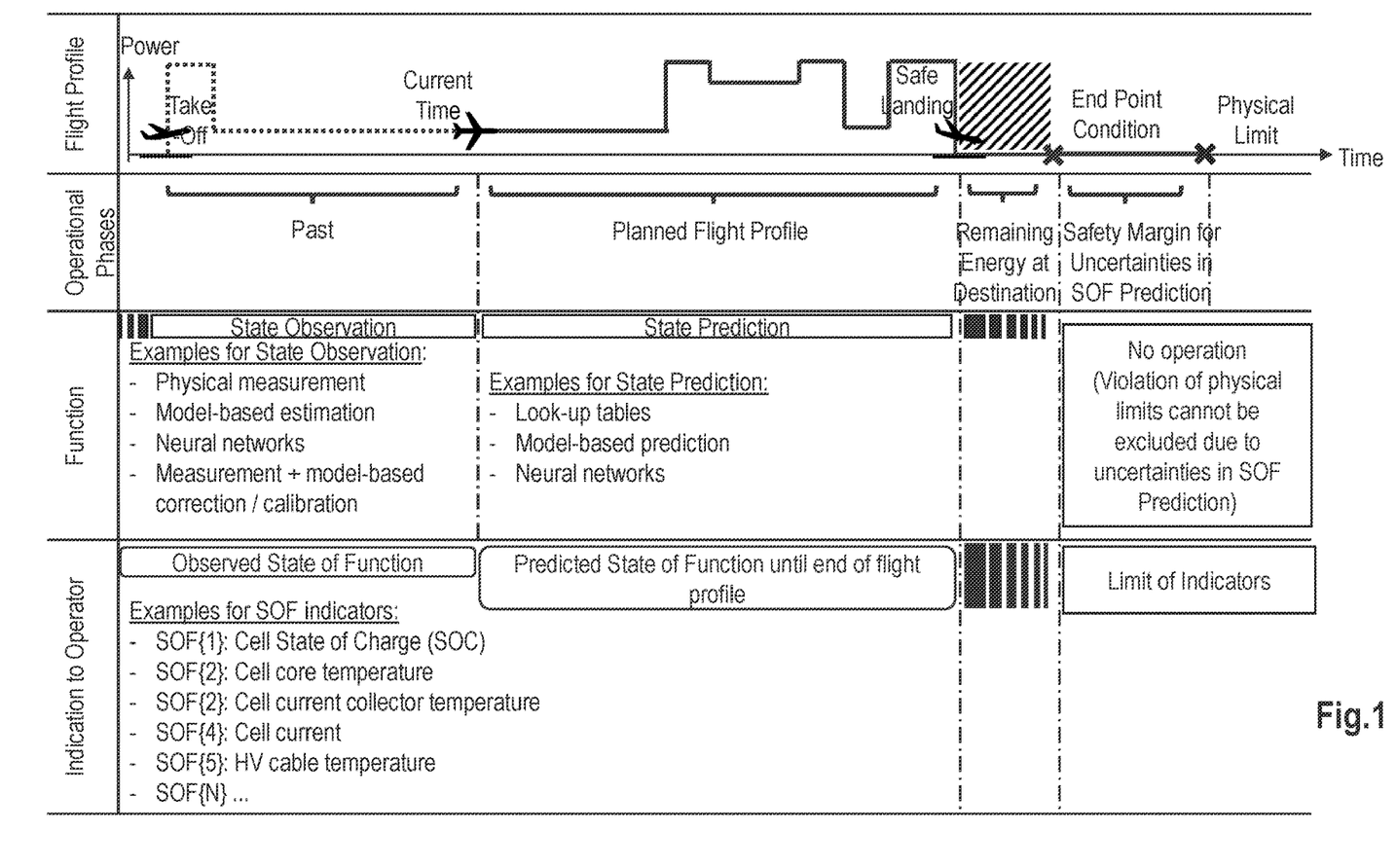
FIG. 1 is an overview diagram illustrating state observation and state prediction for an energy storage system of an air vehicle flying in accordance with a predetermined flight profile.

In the upper portion of FIG. 1, a diagram indicating the required power during the flight according to the profile over time is shown. As can be seen therefrom, the required power is particularly high immediately after take-off and in the final phase of the flight, before landing. In the example shown in the drawing, it is assumed that the current time, indicated by the symbol of an aircraft in a flight state, is in-between the take off and the beginning of the landing phase. Hence, with respect to the current time, the flight phase before lies in the past and the forthcoming flight phase shall be conducted in accordance with the planned flight profile. As further indicated, by means of a hatched box at the end of the flight, a certain amount of energy should remain available at the destination, for reasons of safety. Hence, the endpoint on the timescale is defined by the condition that the predetermined remaining energy is still accessible ("End Point Condition"). In other words, the indicated point later in time ("Physical Limit"), which might still be reachable on the basis of the remaining accessible energy should never be considered as accessible in operation, in order to take into account uncertainties in state prediction.

During the flight, the state of the ESS is permanently monitored ("State Observation"). This includes but is not limited to physical measurements, model-based estimation, observation with the help of neural networks as well as model-based correction/calibration of measurement data. The state observation specifically observes a plurality of states of function State of Function SOF). These may include but are not limited to, for instance, a cell state-of-charge (State of Charge SOC), a cell core temperature, a cell current connector temperature, a cell current, and an HV (high-voltage) cable temperature.

On the basis of the state and health parameter observation before and during the flight phase before the current time (Past), a state prediction is performed for future points in time. In particular, the state prediction may include using look-up tables, model-based prediction and prediction using neural networks, without being limited to these. This enables a prediction of the state, for example, the SOF listed above and indicated in the lower portion of the drawing, until the end of the planned flight profile, by taking into account any safety margin and residual errors determined in advance. In particular, as soon as the remaining accessible energy at the time of landing according to the planned flight profile falls below the predefined "Remaining Energy at Destination," an alert must be issued to the operator immediately so as to ensure safe landing at the nearest available airfield.

An erroneous determination of accessible energy leads to a catastrophic failure condition. This classification is derived from the assumption that the erroneous display of accessible energy would guide a pilot to conduct flight maneuvers, especially flying distances, which the battery cannot sustain with sufficient energy for continued safe flight and landing.

As indicated above, parameters determining a battery state or health, in particular, a state-of-charge or impedance of a battery cell, are generally not directly measurable quantities. For this reason, a problem arises, namely how to determine a battery state-of-charge or health in a reliable manner conforming to the highest safety requirements as applicable in air traffic and, in particular, for electric air vehicles.

BRIEF SUMMARY

The present disclosure aims to provide a battery management system capable of determining and monitoring a battery cell impedance as a battery health parameter of an ESS for an electric air vehicle reliably and so as to comply with the high safety requirements applicable in air traffic, and a respective method.

This is achieved by the features of the independent claims.

According to a first aspect of the present disclosure, a battery management system for an electric air vehicle is provided. The battery management system is adapted to observe a current battery health of a battery system forming an energy storage system of the air vehicle. The battery management system comprises two redundant and dissimilar lanes for battery cell measurements. A first lane of the two lanes comprises equipment for determining a cell impedance as a battery health parameter for each individual battery cell of a plurality of battery cells of the battery system by using Electrochemical Impedance Spectroscopy, EIS. A second lane of the two lanes comprises equipment for performing cell impedance determination using a different algorithm than EIS.

According to a second aspect of the present disclosure, a battery management method of observing a current battery health of a battery system forming an energy storage system of an electric air vehicle is provided. The battery management method comprises the steps of performing a determination of a cell impedance as a battery health parameter for each individual battery cell of a plurality of battery cells of the battery system by using Electrochemical Impedance Spectroscopy, EIS and of independently determining the cell impedance for each individual battery cell of the plurality of battery cells as the battery health parameter based on a different algorithm than EIS.

It is the particular approach of the present disclosure to determine a cell impedance as a battery health parameter and optionally a state-of-charge of an electric air vehicle battery system with the help of two redundant and dissimilar lanes of battery cell measurement means (battery cell measurement equipment), wherein one of the lanes uses Electrochemical Impedance Spectroscopy (EIS). The fact that the two lanes are redundant means that each lane is capable of performing a full health parameter observation, of the ESS at any time, without the need to rely upon any determination made by the other lane. In other words, the measurements by the two lanes are completely independent from each other. The fact that the two lanes are dissimilar means that the algorithms for determining the cell impedance and optionally the state-of-charge and other state variables used by the two lanes are different with respect to each other. In particular, the other one of the two lanes uses a different algorithm than Electrochemical Impedance Spectroscopy.

An essential benefit of the approach of the present disclosure using EIS resides in the fact that EIS is highly accurate and fast in cell impedance observation.

Electrical aircrafts, and, in particular, eVTOL applications are heavily dependent on a low cell impedance to provide the high hover power demands. An increased cell impedance is both the dominant cell ageing mechanism and the dominant cell failure mechanism, Therefore, an increase in cell impedance significantly influences the available energy, i.e., the range of an electric aircraft (eVTOL), and thus safety.

For certification reasons, the eVTOL shall rely on two redundant and dissimilar means (lanes) of cell impedance observation. In conventional approaches, in one of the lanes an ageing model (for example, an empirical ageing model) is used, which runs in the backend and is fed by the utilization data of the aircraft. However, this ageing model cannot observe inhomogeneity in the impedance of multiple cells in a module, nor observe non-linear ageing and cell failures.

A benefit of EIS is the accurate, fast and on-demand physical measurement of each individual cell impedance. This overcomes all the above-mentioned shortcomings of the ageing model and thus leads to a high level of confidence in the determination of the available energy. In fact, this increases the range of the electric aircraft (eVTOL) via unlocking safety buffers for uncertainty in calculating the available energy.

A further benefit of EIS is that it allows for monitoring and updating battery health, in particular, battery cell impedance even during a flight. Hence, state prediction during the flight can be based not only on an up-to-date state but also on updated health information.

According to embodiments, the battery management system is further adapted for battery state observation. Each of the lanes further comprises equipment for performing a state-of-charge or a cell core temperature determination of each individual battery cell. The determination by the first lane is based on EIS. The determination by the second lane is based on a different algorithm than EIS.

In accordance with embodiments, an accessible amount of energy is determined on the basis of the health and optionally SOC observation results in each of the two lanes, in order to determine the flight range based on a model-based state prediction for a planned flight profile. In particular, this is done in case no error in the data determination by the two lanes is detected.

In embodiments, the second lane uses a model-based cell impedance estimation algorithm and optionally a model-based cell SOC or cell core temperature estimation algorithm. The respective model-based algorithms are different and completely independent from EIS used by the first lane, More specifically, the model-based algorithms used by the second lane are based on using a dual Kalman filter.

An additional benefit of embodiments combining EIS and model-based estimation in the two redundant and independent lanes resides in the fact that both algorithms are fundamentally different, which avoids common cause failures in both lanes. This reduces the certification risk of the approach.

Algorithms employed by the second lane are, however, not limited to model-based algorithms. Any other suitable algorithms a skilled person is aware of or will become aware of are equally suitable within the framework of the present disclosure. This includes, for instance, an SOC determination by means of Coulomb Counting. Coulomb Counting is a simple and widespread method used to determine the cell state-of-charge. It is based on measuring the overall charging current and load current of each individual battery cell and integrating the measured current over time.

Initially, a state-of-charge can be determined (reset) by means of an OCV (open circuit voltage) measurement. Alternatively, other methods of resetting or recalibrating the SOC can be used, such as by resetting the SOC to 100% when a charger determines that the battery is fully charged. A regular re-calibration in case of employing a Coulomb Counting algorithm is necessary for avoiding erroneous results due to long-term drift of the observation result.

Coulomb Counting (CC) has the advantages that it has low complexity and is highly deterministic, resulting in low computational effort. This saves weight and cost and reduces the certification risk.

In a lane employing CC for SOC monitoring, an ageing model can be used for battery state-of-health (SOH) monitoring. This model estimates the battery health based on the observed utilization. Examples for parameters characterizing the utilization of the battery system are charge (Ampere hours Ah) throughput, mean temperature and depth of discharge. Input to battery health observation by means of an ageing model is the current, voltage and temperature for each individual cell. Output is the respective health parameter for each individual cell (cell impedance, cell capacity).

An algorithm using an ageing model in a lane for battery state monitoring may be additionally supported by dedicated maintenance procedures, including dedicated charging procedures or predefined pulse power tests.

According to embodiments, the first lane comprises equipment for exciting battery cells of the battery system with sinusoidal current of variable frequency and equipment for measuring the voltage response of each cell. More specifically, the first lane further comprises processing circuitry for calculation of a system impedance spectrum based on a ratio between an input excitation current and voltage response.

In embodiments, the second lane comprises battery cell measurement equipment for measuring at least one of a voltage (for example, a cell terminal voltage), a current (for example, an input or output current) and a temperature (for example, a surface temperature or a cell tab temperature). These parameters are accessible through measurement and may form a basis for calculating parameters indicating the battery state-of-charge and battery health according to well-known algorithms that take into account the particular hardware structure of the battery system and cells, including model-based algorithms.

In embodiments, the air vehicle is an electric vertical take-off and landing aircraft, eVTOL.

In accordance with a further particular aspect of the present disclosure, an air vehicle comprising a battery management system according to the above aspect or each of the embodiments is provided.

Further features and advantages of the present disclosure are set forth in dependent claims.

Embodiments and features of the present disclosure herein described or set forth in the appended claims may be combined unless it is obvious from the context that such a combination is not possible for particular embodiments or features.

BRIEF DESCRIPTION OF THE DRAWINGS

Additional features and advantages of the present disclosure will become apparent in the following and more particular description as illustrated in the accompanying drawings, wherein.

DETAILED DESCRIPTION

The present disclosure relates to a battery management system for electrically driven air vehicles, in particular, eVTOL, for determining a battery health and optionally a state-of-charge of a battery system forming an energy storage system (ESS). This enables the determination of an amount of accessible energy in the ESS so as to determine (predict) the flight range according to a predetermined flight profile, in particular, at any time during the flight.

For this purpose, the present disclosure utilizes an innovative two-lane battery management system architecture that provides two redundant and dissimilar lanes of battery health parameter and state observation, out of which one is based on Electrochemical Impedance Spectroscopy (EIS).

According to the present disclosure, a first lane of the two lanes operates on the basis of EIS. A second lane of the two lanes operates on the basis of a different algorithm. In embodiments, this is a model-based state, in particular, SOC, estimation algorithm, for instance, using a dual Kalman filter, for state, in particular, state-of-charge, observation. Similarly, in accordance with embodiments, for battery health parameters observation, a model-based cell parameter estimation algorithm, for instance, using a dual Kalman filter, is used. In particular, the cell impedance is used as a battery health parameter.

In each lane, a battery state may be predicted via a model-based state prediction for a planned flight profile on the basis of the observed state and health parameters. Specifically, the battery state determines an accessible amount of energy for the flight according to the planned flight profile. The thus determined accessible energy, including a safety margin based on a predetermined maximum error of state prediction, determines the maximum range of the flight and may thus confirm that the planned destination can be safely reached.

The present disclosure provides an implementation of both battery health parameter (SOH) observation and battery state, in particular, SOC, observation in such a way as to fulfil the certification requirements to exclude single points of failure. This is achieved by implementing battery state observation and cell impedance observation (SOH observation) in a redundant and dissimilar way, by two respective lanes determining the states in parallel.

According to embodiments, the battery cell measurements performed by the battery cell measurement equipment of each of the independent lanes are dissimilar to each other. Accordingly, the measurements of physically accessible parameters themselves contribute to the dissimilarity of the lanes. This avoids a situation wherein a system failure occurs due to any principal flaw in a measurement algorithm or principle. Examples for dissimilar measurement schemes are a scheme using PTC (Positive Temperature Coefficient) and a scheme using NTC (Negative Temperature Coefficient) elements for temperature measurements, a scheme using a shunt and a scheme using a Hall sensor for current measurements or schemes using two different ADC (analog-to-digital converter) suppliers for voltage measurement.

A detailed description of the operation of these two redundant and dissimilar lanes of battery state and health parameter observation during all flight phases will be given below with reference to FIG. 2.

Lane 1 (illustrated in the bottom row of the drawing and corresponding to the second lane as introduced in the above summary of the present disclosure) uses a conventional model-based state and health parameters estimation algorithm, for instance, using a dual Kalman filter, for state and health observation. Input to this algorithm is the current, voltage and temperature for each individual cell measured by respective measurement equipment of Lane 1. Output is the estimation of the state (state of function SOF as introduced above) and health parameter for each individual cell. In order to obtain, from the measured parameters, the SOF and health parameter output, respective evaluations are performed on the basis of the model.

Model-based estimation algorithms are well known to a skilled person and a detailed description thereof will therefore be omitted here. They are used for estimating system variables of state that are not directly measurable, such as state-of-charge of a cell, cell core temperature, cell impedance or cell capacity. The approach of model-based algorithms is generally based on a comparison of measurable output variable values of a system having known input variable values with the output of a model of a system for the same input values, wherein at least one model parameter characterizing a variable of state to be estimated is regularly updated on the basis of a difference between the measured system output and the model output, as a feedback.

As input, the current, voltage and temperature for each individual cell measured by the battery cell measurement equipment of a lane employing model-based estimation is used, Estimated system variables are, for example, the state and health parameters for each individual cell. In addition, an inter-active update of results between model-based state estimation and model-based health estimation can be performed if both a model-based health estimation and a model-based state estimation are implemented, as illustrated. In particular, the SOC, and further variables characterizing the battery state of function, for example, the cell core temperature, can be obtained with a model-based algorithm in a similar way.

Lane 2 (illustrated in the middle row of the drawing and corresponding to the first lane as introduced in the above summary of the present disclosure) uses a state and health parameter observation algorithm, which is based on Electrochemical Impedance Spectroscopy (EIS). The EIS actively excites all individual cells with sinusoidal current of variable frequency and measures the voltage response of each cell. The ratio between output and input signal allows the computation of a (complex) system impedance, which depends on the excitation frequency, i.e., system impedance spectrum, A typical frequency range of the excitation current is from the order of Hertz (Hz) to the order of kilohertz (kHz). The system impedance spectrum allows the calculation of the cell impedance as a major battery health parameter. Input to this algorithm is the excitation current of the EIS and the voltage of each individual cell measured by the respective measurement equipment of Lane 2.

EIS is based on an active excitation of all individual cells with sinusoidal current and measurement of the voltage response of each cell. The ratio between output and input signal allows the computation of a complex system impedance. The excitation is made with sinusoidal current of different frequencies. Hence, a frequency dependent voltage response can be obtained. This allows for determination of a frequency dependent system impedance (system impedance spectrum). The system impedance spectrum allows for the derivation of the cell impedance for each individual cell battery as a basic health parameter. Furthermore, the frequency dependent system impedance allows for the derivation of the SOC and the cell core temperature characterizing the cell state for each individual cell.

It is further noted that in the framework of the present disclosure all measurements and observations are made on the level of individual battery cells. For an evaluation, such as for the determination of an accessible energy or range prediction, as well as a potential failure prediction, in view of the high safety requirements in air traffic, always the cell having the lowest capabilities is taken as the basis.

As further illustrated in the drawing, in each of the lanes the observation results are used for state prediction. The state prediction thus takes into account, the up-to-date cell states as well as the up-to-date health parameters. The state prediction serves to report (confirm) whether there is sufficient available energy for the planned flight. The flight profile, in particular, determines the required power over time for the planned flight, which may be calculated in advance, during the flight planning phase, on the basis of such input as an aircraft model, a weather model and a path model, for instance, by a flight management computer system (FMS).

As further illustrated, the thus determined available energy (range based on the planned flight profile) is displayed to an operator (pilot) of the aircraft. This is implemented separately in each of the independent and dissimilar lanes. Hence, the operator has a display separately provided for each of the lanes and can thus compare the results. The operator may compare the separately displayed state prediction results from the two lanes with each other. If there is a deviation between the predicted states from the two lanes and if the magnitude of this deviation exceeds a predetermined threshold, the deviation may prompt an alert to an operator. The operator should then approach the closest airfield (vertiport in case of an eVTOL) possible for safe landing. In any case, the operator can personally compare the state prediction results and decide whether the indication is reliable or an emergency landing is necessary.

During normal operation, i.e., when there is no large deviation, a minimum value of the displayed range (available accessible energy) of both lanes will be used as a basis for any decisions. In this framework, a "minimum value" means a value that corresponds to the lowest amount of remaining accessible energy, i.e., the lowest range (remaining safe flight distance). The same principle is applied for an overall assessment of the battery system on the basis of measurements and observations relating to individual cells. As a basis for the assessment, always the cell is taken, for which a "minimum value" in the sense explained above of an observed state or health parameter is determined.

As further illustrated in the top line of the drawing, the respective operation by both the lanes is continually performed both before the flight (in particular, during charging operation of the battery system) and during the flight between take-off and landing.

Figure 3:
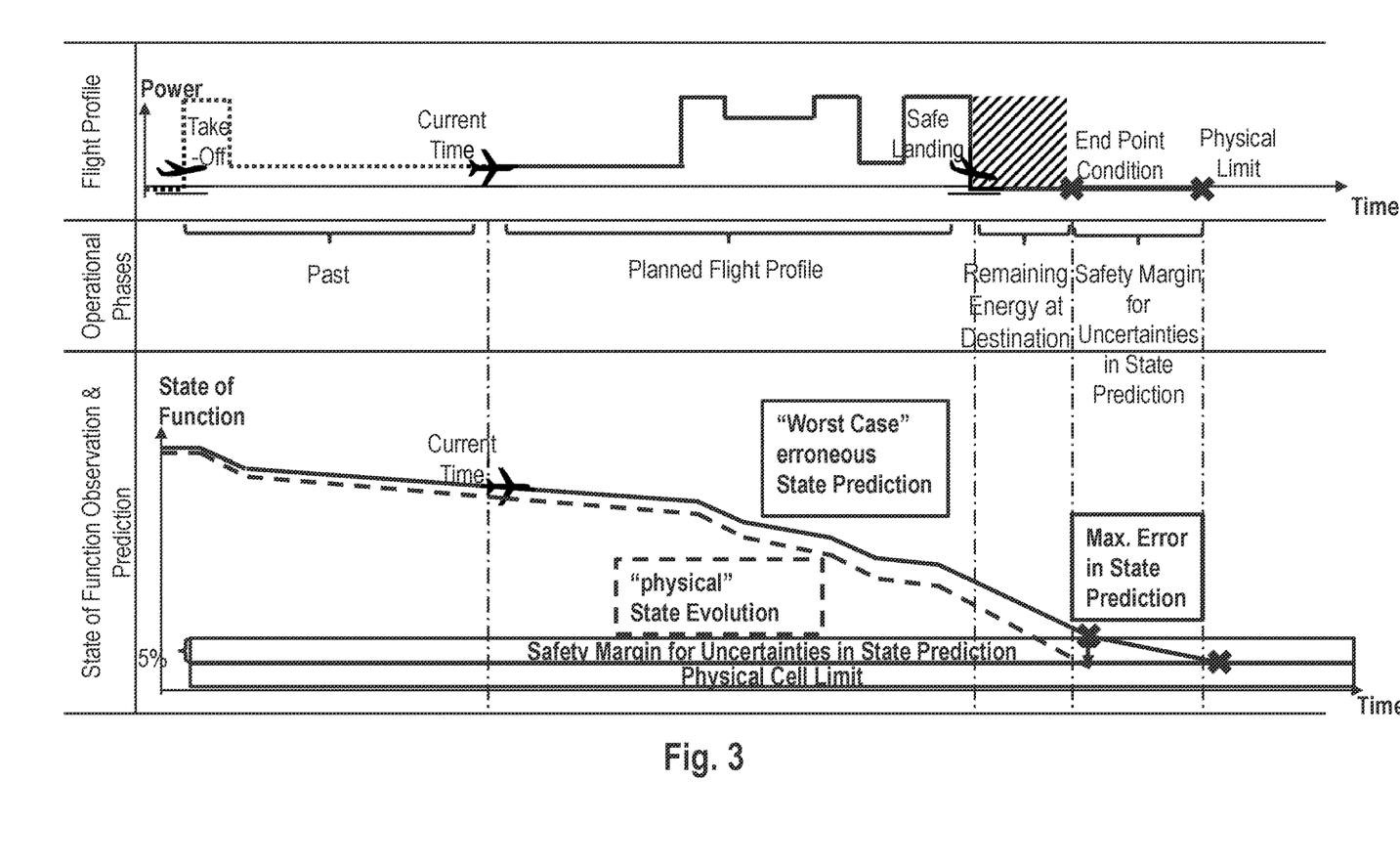
FIG. 3 is a diagram showing details of state prediction during a flight according to a planned flight profile using state-of-charge and battery health observation in accordance with embodiments of the present disclosure.

FIG. 3 illustrates how the results of the battery state and health parameter observation can be used to determine the accessible energy for the air vehicle via a model-based state prediction.

The upper portion of the diagram in FIG. 3 repeats the upper portion of FIG. 1 and shows a diagram indicating the required power during the flight according to the flight profile.

The lower portion of the diagram shows how the redundant and dissimilar lanes allow the calculation of the current system state of function. Based on the observed battery health parameter, the planned flight profile can be used to predict the SOF evolution of each individual cell until the aircraft reached a safe landing condition. A planned flight profile is only valid if the state prediction excludes the violation of a limit. Therefore, the range of an aircraft, in particular, an eVTOL, can be determined based on (multiple) flight profiles, and destinations outside the range of the aircraft can already be safely excluded before take-off.

In order to comply with high safety requirements, a maximum error of the state prediction for a planned flight shall be known in advance (e.g., during the planning phase of the ESS) so as to be taken into account each time, during planning of an individual flight as well as during the flight itself. In the lower portion of the diagram of FIG. 3, the maximum error of state prediction is shown by the distance between the dotted and the dashed line in the diagram showing the state-of-charge observation prediction result over time. This error is measured during lab testing and considered as a safety margin for uncertainties in state prediction.

More specifically, the solid line (upper one of the two lines) labeled "Worst Case" erroneous State Prediction corresponds to the state evaluation result for the flight according to the planned flight profile under the assumption that the maximum error is present. The label "Worst Case" refers to the fact that this prediction includes a maximal overestimation of the available resources (capability), i.e., corresponds to the "worst case" from the point of view of the pilot. The actual available ("physical") capability may be lower than the worst case estimate by the "maximum error," which corresponds to the difference between the solid line and the dotted line. As explained above with reference to FIG. 1 there must still be some remaining accessible energy at the point of destination, for safety reasons ("End Point Condition"). This corresponds to the 5% safety margin for uncertainties in state prediction illustrated in the lower portion of FIG. 3.

The dotted line (lower one of the two lines) labeled "physical state evolution" illustrates the actual remaining state of function in case of a prediction with maximum error according to the solid line, i.e., it proceeds lower of lower than the solid line by a distance corresponding to the maximum error. As will be readily understood by a skilled person, with increasing flight distance the uncertainty of the prediction and thus the error determining the distance between the two lines increases. As a result, at the planned endpoint of the flight (destination) the maximum error in state prediction must not exceed the planned safety margin (in the present example: 5% corresponding to the maximum error at the end point). This guarantees the possibility of a safe flight and landing even in case of prediction with maximum error.

Figure 4:
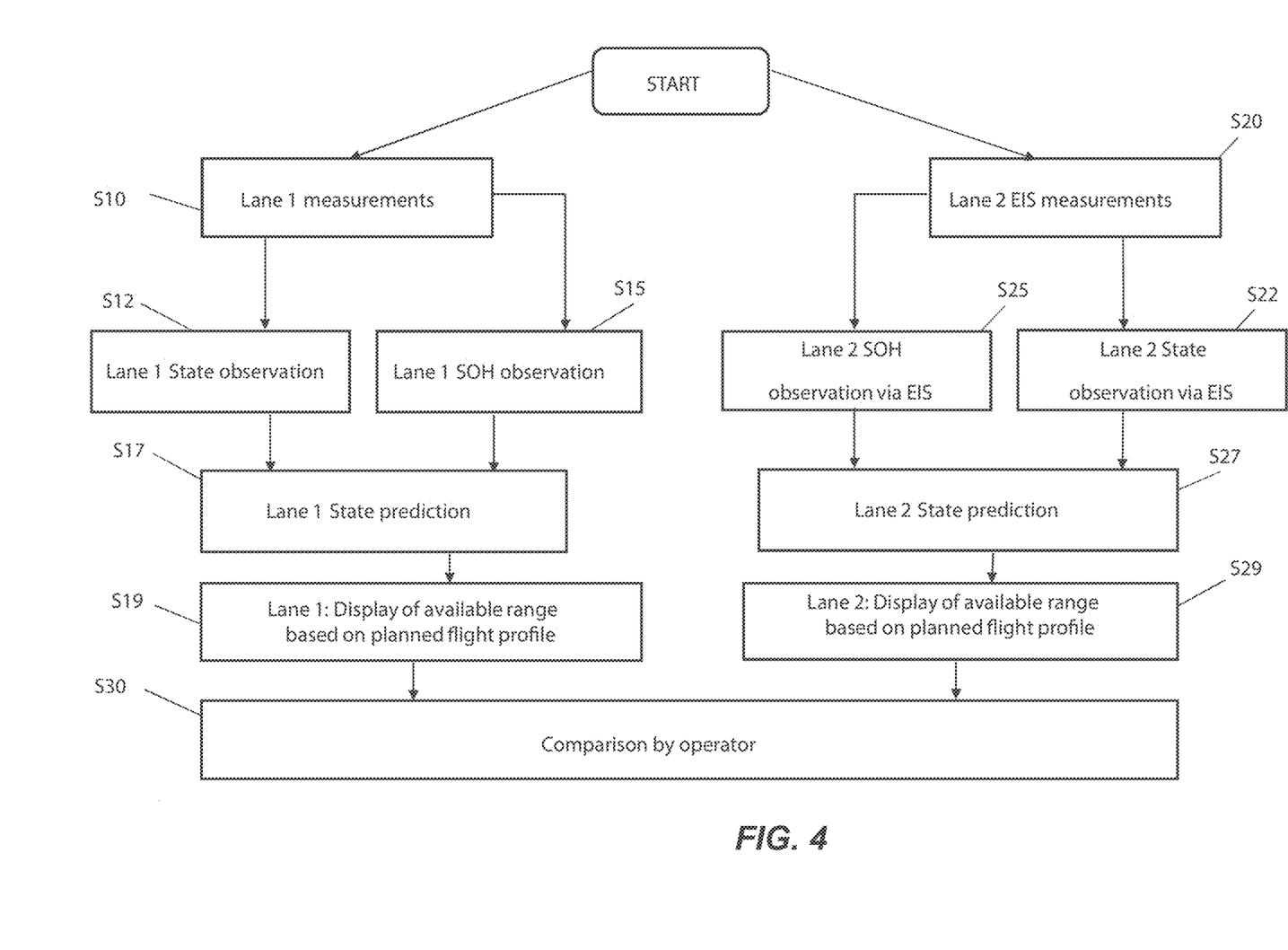
FIG. 4 is a flowchart illustrating basic steps of an exemplary battery Management method.

FIG. 4 is a flowchart of an exemplary method that can be performed by a battery management system according to embodiments of the present disclosure.

Figure 2:
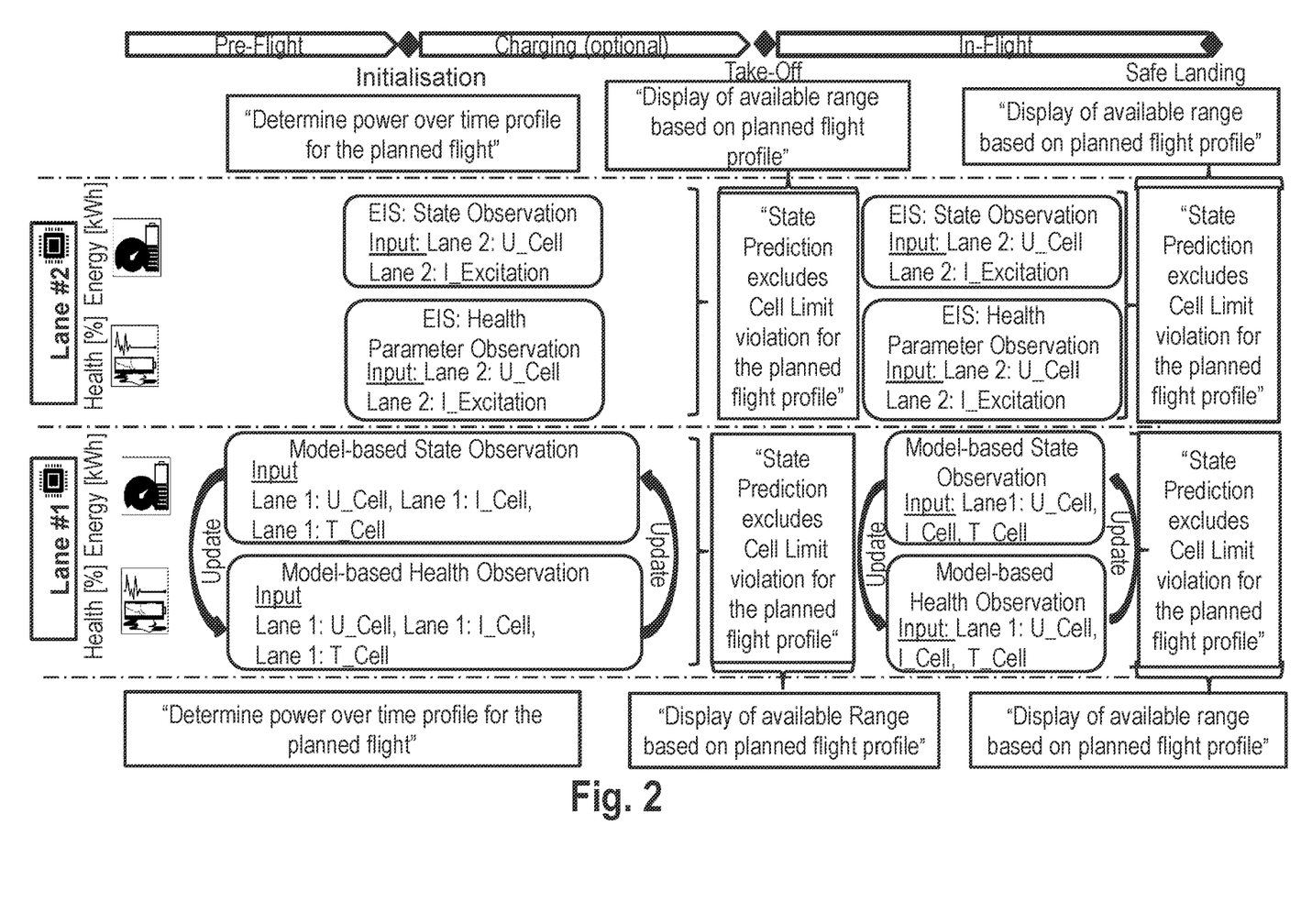
FIG. 2 is a diagram showing the operation of a two-lane battery management system for state and health observation in accordance with embodiments of the present disclosure in the phases before and during a flight.

In the upper portion of the flowchart, on the left-hand side, the operation performed by Lane 1 illustrated in the lower portion of FIG. 2 is illustrated. Specifically, in step S10, respective measurements are performed at the individual battery cells. This includes, in particular, measurements of cell voltages, currents and temperatures.

In subsequent step S12, a state, in particular, SOC, is derived on the basis of the measurements. In embodiments, this is done using a model-based approach, wherein the state is derived from an equivalent circuit model. Optionally, a cell core temperature can be additionally derived from the cell temperature measurement. In embodiments, this is done using a model-based approach as well, wherein the cell core temperature is derived from an equivalent circuit model as well. However, processing by Lane 1 is not limited to this, but any other approach, different from EIS, can be used by Lane 1 as well. In parallel, step S15 performs a determination of the cell impedance as an SOH parameter. In embodiments, this is done by using a model-based approach as well. In that case, relevant parameters of the equivalent circuit model are updated online during estimation and between state and health estimation, as illustrated in FIG. 2. Again, processing by Lane 1 is not limited to this, but any other approach, different from EIS, can be used for SOH estimation in Lane 1 as well.

Processing then proceeds to step S17, wherein the individual determination results obtained (estimated) by Lane 1 are used as a basis for predicting the battery state, i.e., the remaining accessible energy defining the remaining range according to the planned flight profile. In the following step S19, a respective display to an operator is made on a first display (or first display portion) corresponding to the prediction by the Lane 1. The display can be implemented in various forms such as by graphical representation or a numerical or symbolic indicator, whatever is suitable for easily and quickly grasping the situation and, in particular, a possible forthcoming emergency.

On the right-hand side of the upper portion of the flowchart, the respective operation performed by Lane 2 illustrated in the middle portion of FIG. 2 is shown. Specifically, in step S20 the EIS measurements for obtaining the impedance spectrum of each cell of the battery system are performed as described above, i.e., by comparing a frequency dependent excitation current with the respective voltage response.

In step S22, for each cell, a battery cell state, in particular, SOC is derived on the basis of the impedance spectrum obtained in step S20. Optionally, also the cell core temperature can be derived on the basis of the impedance spectrum in step S22. In parallel, step S25 determines the cell impedance of each individual battery cell on the basis of the measurements in step S20.

Processing then proceeds to step S27, wherein the individual determination results obtained (estimated) by Lane 2 are used as a basis for predicting the battery state, i.e., the remaining accessible energy defining the remaining range according to the planned flight profile. In the following step S29, a respective display to an operator is made on a second display (or second display portion) corresponding to the prediction by Lane 2. Again, the display can be implemented in various forms such as by graphical representation or a numerical or symbolic indicator.

In final step S30, an operator compares the displayed state prediction results. In particular, an operator may conclude the presence of an error in at least one of the lanes if a difference between a state prediction result by Lane 1 and Lane 2 exceeds a predetermined threshold, and can decide to initiate a landing procedure at the nearest available airfield, because no reliable prediction regarding remaining accessible energy is possible in case of a failure in one of the lanes. A comparison may also be performed by the system and issue an alert to the operator if an error is detected based on a too large deviation between the lanes.

In summary, the present disclosure relates to a battery management system and method for performing a battery health parameter observation, in particular, cell impedance observation, with two redundant, independent and dissimilar lanes. Specifically, a cell impedance observation in a first one of the lanes is based on Electrochemical Impedance Spectroscopy, EIS. The other lane employs a different algorithm than EIS. In embodiments, a battery state observation is further performed independently by the two lanes, wherein again the first lane employs EIS and the other lane a different (dissimilar) algorithm. On the basis of state and health observation, state (state of function) of the battery system can be predicted to determine a range of flight in accordance with a predetermined flight profile.

What is claimed is:

1. A battery management system for an electric air vehicle, the battery management system being adapted to observe a current battery health of a battery system forming an energy storage system of the air vehicle, the battery management system comprising two redundant and dissimilar lanes for battery cell measurements, wherein:
   a first lane of the two lanes comprises equipment to determine a cell impedance as a battery health parameter for each individual battery cell of a plurality of battery cells of the battery system by using Electrochemical Impedance Spectroscopy (EIS); and
   a second lane of the two lanes comprises equipment to perform cell impedance determination using a different algorithm than EIS.

2. The system according to claim 1, wherein the battery management system for the electric air vehicle is adapted for battery state observation, and wherein:
   each of the lanes comprises equipment to perform a state-of charge (SOC) or a cell core temperature determination of each individual battery cell;
   the determination by the first lane is based on EIS; and
   the determination by the second lane is based on a different algorithm than EIS.

3. The system according to claim 1, wherein the second lane utilizes a model-based cell impedance estimation algorithm or cell core temperature estimation algorithm.

4. The system according to claim 3, wherein the model-based cell impedance estimation algorithm or algorithms utilized by the second lane utilize a dual Kalman filter.

5. The system according to claim 1, wherein the second lane comprises equipment to measure at least one of a current, a voltage and a temperature of each individual cell of the plurality of battery cells of the battery system.

6. The system according to claim 1, wherein the first lane comprises equipment to excite battery cells of the battery system with sinusoidal current of variable frequency and equipment to excite a voltage response of each cell.

7. The system according to claim 6, wherein the first lane further comprises processing circuitry to calculate a system impedance spectrum based on a ratio between an input excitation current and a voltage response.

8. The system according to claim 1, wherein the air vehicle is an electric vertical take-off and landing aircraft (eVTOL).

9. An air vehicle comprising a battery management system for an electric air vehicle, the battery management system being adapted to observe a current battery health of a battery system forming an energy storage system of the air vehicle, the battery management system comprising two redundant and dissimilar lanes for battery cell measurements, wherein:
   a first lane of the two lanes comprises equipment to determine a cell impedance as a battery health parameter for each individual battery cell of a plurality of battery cells of the battery system by using Electrochemical Impedance Spectroscopy (EIS); and
   a second lane of the two lanes comprises equipment to perform cell impedance determination using a different algorithm than EIS.

10. A battery management method of observing a current battery health of a battery system forming an energy storage system of an electric air vehicle, the battery management method comprising:
    determining a cell impedance as a battery health parameter for each individual battery cell of a plurality of battery cells of the battery system utilizing Electrochemical Impedance Spectroscopy (EIS); and
    independently determining the cell impedance for each individual battery cell of the plurality of battery cells as the battery health parameter based on a different algorithm than EIS.

11. The method according to claim 10, further comprising:
    determining a state-of-charge (SOC) or a cell core temperature of each individual battery cell based on EIS; and independently determining the state-of-charge or the cell core temperature of each individual battery cell at least partially based on a different algorithm than EIS.

12. The method according to claim 11, wherein the different algorithm is a model-based cell impedance estimation algorithm.

13. The method according to claim 12, wherein the model-based cell impedance estimation algorithm utilized by a second lane utilizing a dual Kalman filter.

14. The method according to claim 12, wherein the model-based cell impedance estimation algorithm comprises measuring at least one of a current, a voltage and a temperature of each individual cell of the plurality of battery cells of the battery system.

15. The method according to claim 10, wherein utilizing EIS comprises:
   exciting battery cells of the battery system with sinusoidal current of variable frequency and measuring a voltage response of each cell.

\* \* \* \* \*